US011515116B2

(12) United States Patent
Lee et al.

(10) Patent No.: US 11,515,116 B2
(45) Date of Patent: Nov. 29, 2022

(54) MONITORING AND LOCATING FUSE CUTOUTS

(71) Applicant: Avista Corporation, Spokane, WA (US)

(72) Inventors: Erik Jon Lee, Spokane, WA (US); Curtis Allen Kirkeby, Spokane, WA (US); Matthew Russell Michael, Newman Lake, WA (US)

(73) Assignee: Avista Corporation, Spokane, WA (US)

(*) Notice: Subject to any disclaimer, the term of this patent is extended or adjusted under 35 U.S.C. 154(b) by 928 days.

(21) Appl. No.: 16/164,557

(22) Filed: Oct. 18, 2018

(65) Prior Publication Data
US 2020/0126748 A1 Apr. 23, 2020

(51) Int. Cl.
H01H 85/02 (2006.01)
G01R 31/08 (2020.01)
H02H 7/04 (2006.01)
H02H 1/00 (2006.01)
H02H 3/04 (2006.01)
H01H 71/08 (2006.01)

(52) U.S. Cl.
CPC ....... H01H 85/0241 (2013.01); G01R 31/085 (2013.01); H02H 1/0061 (2013.01); H02H 3/046 (2013.01); H02H 7/04 (2013.01); H01H 2071/088 (2013.01)

(58) Field of Classification Search
CPC ............ G01R 31/085; G01R 31/086; H01H 2071/088; H01H 85/30; H01H 85/0241; H02H 1/0061; H02H 3/046; H02H 7/04
See application file for complete search history.

(56) References Cited

U.S. PATENT DOCUMENTS

| 2011/0193675 A1* | 8/2011 | Darr | H01H 21/16 337/187 |
| 2013/0205900 A1* | 8/2013 | Nulty | H02J 13/00 73/514.01 |
| 2017/0059640 A1* | 3/2017 | Haensgen | H01H 85/38 |
| 2017/0263406 A1* | 9/2017 | Rosenquist | G01S 19/14 |

* cited by examiner

Primary Examiner — Son T Le
Assistant Examiner — Adam S Clarke
(74) Attorney, Agent, or Firm — Lee & Hayes, P.C.

(57) ABSTRACT

This disclosure describes techniques implemented at least in part by a fuse-monitoring device to detect when a fuse cutout in an electric power system opens to disconnect a device and/or a load from a power line, and provides an indication of a location of the opened fuse cutout to a utility provider. The fuse-monitoring device may be attached to a fuse holder of the fuse cutout, and may include a movement sensor that detects when the fuse holder swings open due to its fuse melting, or blowing. The fuse-monitoring device may send a notification to the utility provider indicating that the fuse holder has swung open. The fuse-monitoring device may include a GPS sensor to determine the location of the fuse cutout, and may also notify the utility provider of the location of the fuse cutout so a line crew can quickly locate the fuse cutout that requires maintenance.

22 Claims, 7 Drawing Sheets

MONITORING AND LOCATING FUSE CUTOUTS

BACKGROUND

In electric power distribution, fuse cutouts are utilized on power lines to protect devices and loads from overcurrent due to current surges or other current overloads. In a distribution line example, an overcurrent caused by a fault in a transformer may result in a fuse of a fuse cutout to melt, which results in a fuse holder (or fuse body) of the cutout to swing open and disconnect the transformer from a power line. While these fuse cutouts are essential power-protection devices to protect devices and loads from overcurrent, once a fuse of a fuse cutout is blown, the fuse must be manually replaced by line crews. Although the act of manually replacing the blown fuse is relatively simple, the process of tracing the location of the fuse cutout with the blown fuse in the power grid can be time and/or resource intensive.

Utility providers utilize various techniques to help narrow down a location of a fuse cutout that has a blown fuse, such as through phone calls or other communications from customers who have lost power. Additionally, utility providers may utilize fault indicators that detect changes in magnetic fields caused by overcurrent flows through the fuses, and provide localized, visual indications (e.g., blinking lights) to line crews indicating which fuse cutout needs maintenance. However, line crews still experience difficulties narrowing down the location of fuse cutouts that utilize fault indicators in order to see the visual indication of which fuse cutout requires maintenance. Accordingly, utility providers often suffer from time and resource inefficiencies when locating fuse cutouts that have blown fuses which require maintenance from line crews.

BRIEF DESCRIPTION OF THE DRAWINGS

The detailed description is set forth below with reference to the accompanying figures. In the figures, the left-most digit(s) of a reference number identifies the figure in which the reference number first appears. The use of the same reference numbers in different figures indicates similar or identical items. The systems depicted in the accompanying figures are not to scale and components within the figures may be depicted not to scale with each other.

FIG. 7 illustrates a state diagram indicating example power states that a fuse-monitoring device progresses through.

DETAILED DESCRIPTION

Figure 1:
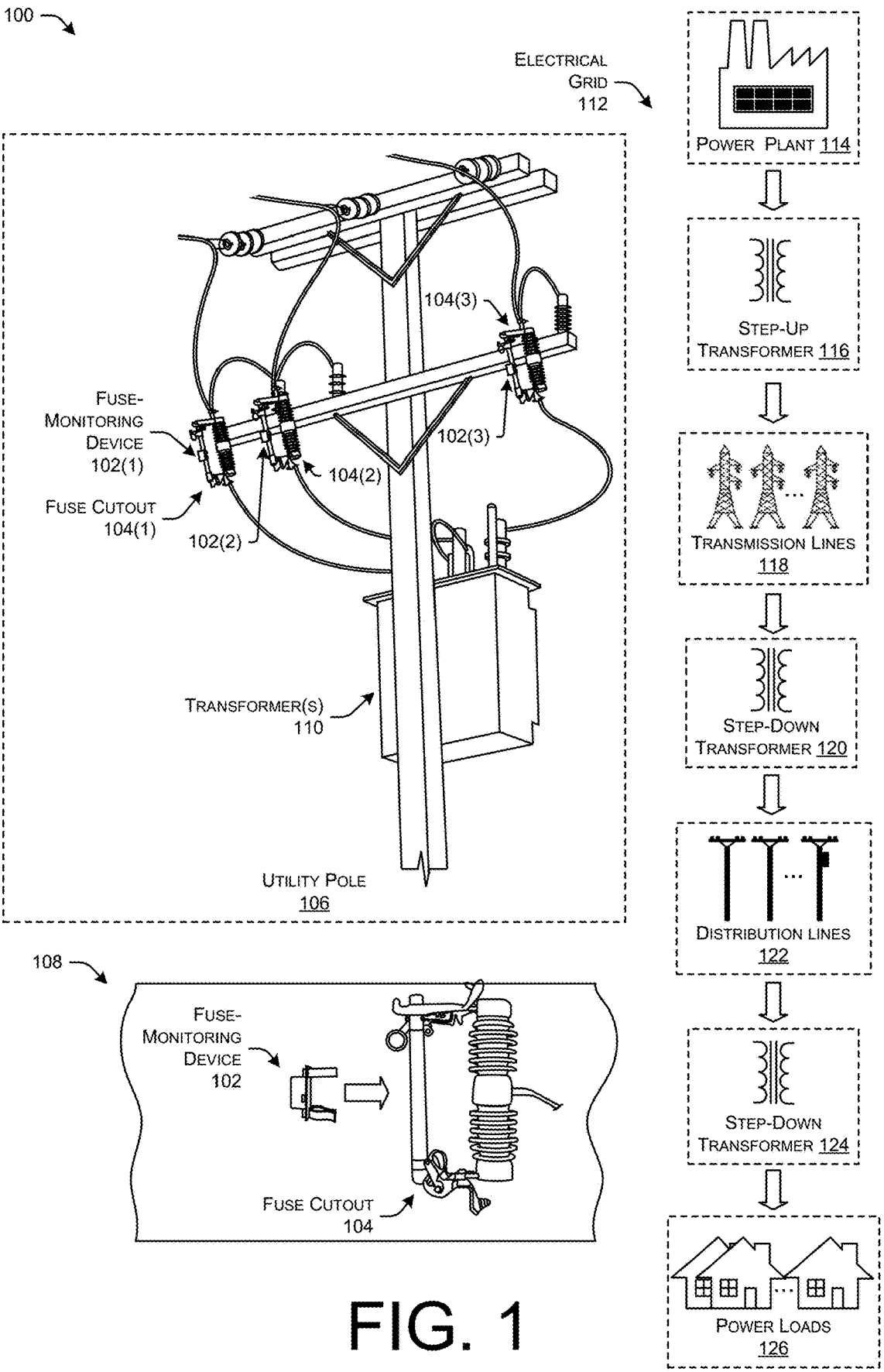
FIG. 1 illustrates an example environment where fuse-monitoring devices are attached to fuse cutouts for a three-phase power line on a utility pole in an electric power grid. The illustrated fuse-monitoring devices are installed to monitor the fuse cutouts in order to help a utility provider, or other entity, determine a location of a fuse cutout with a blown fuse.

This disclosure describes techniques implemented at least in part by a fuse-monitoring device that detects when a fuse cutout in an electric power system disconnects a device and/or a load from a power line, and provides an indication of a location of the disconnected fuse cutout to a service provider, such as a utility provider. In some examples, the fuse-monitoring device described herein is detachably coupled to a fuse holder (also referred to herein as a "fuse tube") that houses a fuse of the fuse cutout such that, when the fuse melts or "blows" and causes the fuse holder to swing open, a movement sensor housed in the fuse-monitoring device may detect the swinging of the fuse holder. The fuse-monitoring device may also include a global positioning system (GPS) sensor to determine a location of the fuse-monitoring device, and upon detecting the movement caused by the swinging of the fuse holder, transmit a notification to the service provider indicating the location of the opened fuse cutout. Further, the fuse-monitoring device may notify the service provider of the time when the fuse cutout opened, and also a device identifier for the fuse-monitoring device. In this way, utility providers or other service providers may in real-time or near-real-time identify more precise locations of fuse cutouts that opened, and dispatch line crews to replace the fuse and/or remedy the condition that caused the overcurrent. Accordingly, the fuse-monitoring devices described herein leverage the use of relatively simple movement sensors and GPS sensors to efficiently monitor and locate fuse cutouts that require maintenance, thereby conserving time and resources.

In some examples, the fuse-monitoring device described herein may include one or more fuse-attachment mechanisms, such as snap-fit or press-fit clips, that allow line crews to easily attach, and detach, the fuse-monitoring device from a fuse holder of a fuse cutout. Further, the fuse-attachment mechanism may be interchangeable such that differently sized fuse-attachment mechanisms may be added and removed from the fuse-monitoring device to enable the fuse-monitoring device to be attached to differently sized fuse holders. Additionally, to allow line crews to quickly and safely install the fuse-monitoring device, the fuse-monitoring device may also include a hot-stick attachment mechanism such that a lineman can install the fuse-monitoring device on a fuse holder using a hot stick (i.e., an insulated pole often made of fiberglass).

The fuse-monitoring device may also include one or more movement sensors that generate sensor data indicating movement of the fuse-monitoring device. For instance, the movement sensor may be an accelerometer, a gyroscope, a ball bearing tilt switch, and/or any other type of sensor that generates data which can be used to determine if a change in position and/or orientation of the fuse-monitoring device has occurred. The fuse-monitoring device may determine that more than a threshold amount of movement or more than a threshold change in orientation has occurred to ensure that wind or other causes of slight movement are not identified as a false positive for the opening of the fuse holder of the fuse cutout.

Upon detecting a change in orientation and/or a change in position of the fuse-monitoring device that indicates the fuse holder has swung open, the fuse-monitoring device may transmit, or otherwise send, a notification to one or more other devices that indicate the fuse cutout has disconnected. For instance, the fuse-monitoring device may include a GPS sensor and send a location of the fuse-monitoring device that was determined using the GPS sensor to another device. Thus, the fuse-monitoring device may send a notification to another device, such as an intermediary node in a communication network, or directly to a server of the utility provider that manages the fuse cutout, that indicates the location of the fuse cutout that has opened. In some examples, the fuse-monitoring device may send the location determined using the GPS sensor upon being installed on the fuse holder. In this way, the utility provider is able to manage the locations of their installed fuse-monitoring devices. Thus, when a subsequent notification is received from the fuse-monitoring device indicating that the fuse holder of the fuse cutout has opened, the utility provider may determine the location of the fuse-monitoring device based solely on the device identifier that is included in the notification.

In some instances, the fuse-monitoring device may be battery powered by an internal battery supply. In such examples, it may be advantageous to switch into a lower-power mode at different times. For example, once the fuse-monitoring device has detected a change in orientation and/or position that indicates the fuse holder opened, and sent the notification that the fuse holder opened to the provider company, the fuse-monitoring device may enter into a lower-power mode by powering down some, or all, of the electric components in order to save power. The fuse-monitoring device may include one or more input devices, such as a button, that switch the fuse-monitoring device from the lower-power mode into the normal-power mode upon receiving input. For instance, a lineman that has replaced the fuse holder on the fuse cutout may press the button to cause the fuse-monitoring device to leave the lower-power mode and enter into the normal-power mode to detect the fuse holder swinging open again. In this way, changes in position and/or orientation of the fuse-monitoring device that may occur while the fuse holder is open and swinging around and/or during movement of the fuse-monitoring device may not drain the battery of the fuse-monitoring device.

In various examples, the fuse-monitoring device may include a communication component that allows the fuse-monitoring device to send the notification to the utility provider on its own. In other words, the fuse-monitoring device may include a communication component that allows the fuse-monitoring device to communicate over various networks, such as cellular network and/or Advanced Metering Infrastructure (AMI) networks. However, to save power and/or reduce the cost of manufacturing the fuse-monitoring device, the fuse-monitoring device may include a less complex communication component that allows the fuse-monitoring device using short-range communication standards (e.g. Bluetooth, Wi-Fi, ZigBee, etc.). In such examples, the fuse-monitoring device may transmit or send the notification that the fuse holder has opened to a hub device that is within a transmission range of the short-range communication standards, such as on a same power pole as the fuse cutout. In turn, the hub device may then cause the notification to be sent, or relayed, to the servers of the utility provider.

Once the utility provider has received the notification that the fuse-monitoring device has detected an opening of the fuse holder of a fuse cutout, the utility provider may take an appropriate action. For instance, the notification may indicate a time at which the fuse holder opened, a device identifier for the fuse-monitoring device, and/or a location of the fuse-monitoring device. In some examples, the utility provider may have previously received and stored the location of the fuse-monitoring device, and may only receive the device identifier for the fuse-monitoring device in order to determine the location. Once the utility provider has received the notification that the fuse-monitoring device detected an opening of a fuse holder, the utility provider may dispatch a line crew or lineman to perform the appropriate maintenance to remedy the condition that resulted in the overcurrent, and/or to replace the fuse holder. The line crew may be provided with the GPS location of the fuse-monitoring device, and may also be provided with an indication of the type of fuse that the fuse-monitoring device is monitoring. In this way, the line crew can ensure they have the correct fuse holder to replace the blown fuse link.

In some examples, the fuse-monitoring device may further include various output devices that locally help the line crew identify the blown fuse holder. For instance, the fuse-monitoring device may include one or more lights which light up once the fuse-monitoring device detects that the fuse holder swung open. Additionally, or alternatively, the fuse-monitoring device may include one or more loudspeakers that emit an alarm sound once the fuse-monitoring device detects that the fuse holder swung open. In this way, when the line crew approaches the GPS location of the fuse-monitoring device, the local indications provided by the fuse-monitoring device may further help the line crew quickly determine which fuse-monitoring device is attached to the blown fuse holder.

The techniques described herein effect and improve upon fault detection devices, and/or other electric power grid devices, in various ways. Rather than utilizing more resource hungry, power hungry, and expensive sensors or hardware, the fuse-monitoring devices described herein utilize simple sensors, such as motion sensors, which require less processing power, less battery power, and are inexpensive. Thus, the internal battery for the fuse-monitoring device may experience a longer life, and the processor requirements may be lessened for the fuse-monitoring device, while achieving at least the same results as traditional fault indication devices.

While various techniques described in this application include the use of movement sensors to detect movement of a fuse cutout, any other type of sensor usable to determine that a fuse cutout has blown may be used. For example, a fuse holder may not always swing open when the fuse has blown. However, other types of sensors may be utilized to determine that the fuse has blown despite there not being a swinging motion. Thus, the fuse-monitoring devices described herein may in addition to movement sensors, or as an alternative to movement sensors, include one or more of a vibration sensor (e.g., accelerometer), a thermal sensor, a microphone, an inductive sensor, etc. For instance, an accelerometer may detect the fuse holder vibrating when the fuse has blown, but not swinging, that indicates the fuse has blown. A thermal sensor may detect heat that is emitted from a fuse melting in the fuse holder when the fuse has blown. A microphone may detect sound that is characteristic of a fuse blowing inside of the fuse holder, etc.

While the examples described herein are primarily with respect to monitoring fuse cutouts, some or all of the techniques are equally applicable to other types of devices, such as reclosers, regulators, etc. For instance, the use of unique identifiers and GPS location data may also be utilized to store and monitor locations of electric power devices in the field.

Certain implementations and embodiments of the disclosure will now be described more fully below with reference to the accompanying figures, in which various aspects are shown. However, the various aspects may be implemented in many different forms and should not be construed as limited to the implementations set forth herein. The disclosure encompasses variations of the embodiments, as described herein. Like numbers refer to like elements throughout.

FIG. 1 illustrates an example environment 100 where fuse-monitoring devices 102(1), 102(2), and 103(3) (collectively referred to as "fuse-monitoring devices 102") are attached to fuse cutouts 104(1), 104(2), and 104(3) (collectively referred to as "fuse cutouts 104") for a three-phase power line on a utility pole 106 in an electric power grid. The illustrated fuse-monitoring devices 102 are installed to monitor the fuse cutouts 104 in order to help a utility provider, or other entity, determine a location of a fuse cutout 104 with a blown fuse. Although the fuse-monitoring devices 102 are illustrated as being used for three-phase power lines, any number of fuse-monitoring devices 102 may be utilized for any number of fuse cutouts 104. The techniques described herein may be applied for a single fuse cutout 104 for single-phase power, two fuse cutouts 104 for two-phase power, three phase cutouts 104 for three-phase power, a plurality of fuse cutouts 104 for an entire service lateral, or any number of fuse cutouts 104. In such examples, any number of fuse-monitoring devices 102 may be employed to monitor the various numbers of fuse cutouts 104. For instance, one fuse-monitoring device 102 may be used for each fuse cutout 104 involved, one fuse-monitoring device 102 may be used for three fuse cutouts 104 for three-phase power, or any other ratio of fuse cutouts 104 to fuse-monitoring devices 102.

Generally, the fuse-monitoring device 102 may comprise a box, or any other structure, configured to be detachably coupled to a fuse holder of a fuse cutout 104. For instance, the fuse-monitoring device 102 may include, or have, attachment mechanisms that allow for the fuse-monitoring device 102 to be detachably coupled to a fuse holder of a fuse cutout 104. In some examples, the fuse-monitoring device 102 may be removed by a utility provider, serviced, and re-provisioned in the field for use on another fuse cutout 104.

As illustrated in the blow-up 108 of the fuse-monitoring device 102 and the fuse cutout 104, the fuse-monitoring device 102 may include press-fit or snap-fit clips that allow the fuse-monitoring device 102 to be removably attached to a fuse holder of the fuse cutout 104. However, any other type of attachment mechanism may be utilized to attach the fuse-monitoring device 102 to the fuse holder of the fuse cutout 104. As illustrated, each of the fuse cutouts 104 are configured to prevent, for a respective phase, an overcurrent from flowing to one or more transformers 110. However, the techniques are equally applicable for any type of fuse cutouts 104 configured to prevent overcurrent from flowing to devices and/or loads.

FIG. 1 further provides an example electrical grid 112 in which the techniques performed by the fuse-monitoring devices 102 are applicable. As illustrated, the example electrical grid 112 includes power plants 114 that generate electricity to be provided to various loads, such as consumer loads. The power generated by the power plant 114 may flow through one or more step-up transformers 116 which step up a voltage of the power generated by the power plant 114 to a voltage that is used to transmit the power over transmission lines 118 (e.g., step-up the voltage from 12 kilovolts (kV) to 500 kV). The power may be transmitted over the transmission lines at the stepped-up voltage, and then pass through a first step-down transformer 120 that may step down the voltage to a voltage that is used to distribute power across distribution lines 122 (e.g., step-down the voltage from 500 kV to 13 kV). After being distributed across the distribution lines 122, the power may then be stepped down again using a step-down transformer 124 to a voltage usable by power loads 126 (e.g., step-down the voltage from 13 kV to 240V).

In the illustrated example, the fuse cutouts 104 may be preventing overcurrent from flowing to the transformers 110, which may be the step-down transformer 124 (e.g., distribution transformer) where the utility pole 106 is part of a distribution line 122. However, the fuse cutouts 104 may be positioned to protect any type of transformer or electrical device from current surges and overloads.

Figure 2:
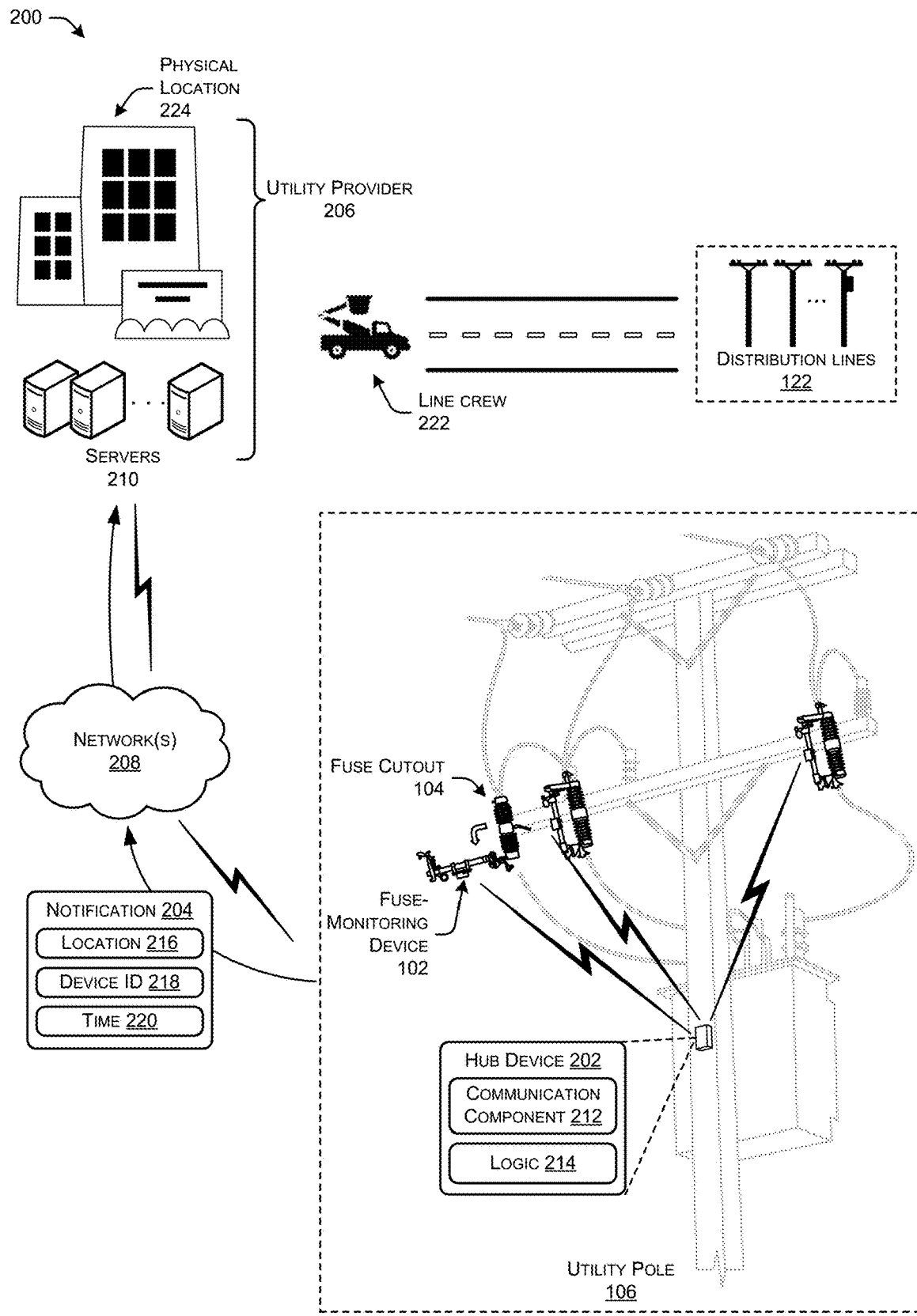
FIG. 2 illustrates an example environment where at least one fuse-monitoring device determines that a fuse of a fuse cutoff has blown. The fuse-monitoring device, and/or a hub device, may send a notification to a utility provider that indicates the location of the fuse cutout with the blown fuse.

FIG. 2 illustrates an example environment 200 where at least one fuse-monitoring device 102 determines that a fuse of a fuse cutoff 104 has blown. The fuse-monitoring device 102, and/or a hub device 202, may send a notification 204 to a utility provider 206 that indicates the location in the distribution lines 122 of the fuse cutout 104 with the blown fuse.

Generally, the fuse cutout 104 may be a combination of a fuse and a switch such that, when an overcurrent caused by a fault in the transformer passes through the fuse of the fuse cutout 104, the fuse will melt and cause the switch to open the fuse holder, thereby disconnecting the transformer from the power line. The fuse holder may be mounted at an angle, such as 20 degrees off vertical, so the center of gravity of the fuse holder is displaced such that the fuse holder will rotate, or swing, and fall open under its own weight when the fuse blows. Thus, the fuse holders of fuse cutouts 104 may swing open when the fuse blows.

In some examples, the techniques performed by the fuse-monitoring device 102 may take advantage of the movement of the fuse holder of the fuse cutouts 104 to determine that the fuse blew. For instance, the fuse-monitoring device 102 may include a movement sensor that detects at least one of a change in position or change in orientation of the fuse-monitoring device 102. Thus, when the fuse-monitoring device 102 is attached to the fuse holder of the fuse cutout 104, and the fuse melt or blows thereby resulting in the fuse holder swinging open (as illustrated), the fuse-monitoring device 102 is able to detect, using the movement sensor, that the fuse holder opened, and thus determine that the fuse blew.

In some examples, the fuse-monitoring device 102 may include a communication component and logic that enables the fuse-monitoring device 102 to transmit the notification 204 over one or more networks 208 to servers 210 of the utility provider 206. For instance, the fuse-monitoring device 102 may include a cellular network modem, a communication component configured to communicate over various utility networks (e.g., Advanced Metering Infrastructure (AMI) networks, Automatic Meter Reading (AMR) networks, etc.), and/or various wide-area networks (e.g., Internet). However, the network(s) 208 may comprise any type of network, and/or any combination of wired and/or wireless networks.

In various examples, the fuse-monitoring devices 102 may each be configured to communicate with a hub device 202 over shorter distances, such as by using a short-range wireless standard (e.g., Bluetooth, Wi-Fi, ZigBee, etc.). For instance, the fuse-monitoring devices 102 may be "dumb" nodes in that they have smaller processors and/or communication components than the hub device 202, which may elongate the battery life of the fuse-monitoring devices 102. Further, the hub device 202 may be a "smart" node in that it is capable of communicating, using a communication component 202, over the various network(s) 208. The hub device 202 may be located within a transmission range of the short-range wireless standard, such as mounted on the utility power 106, and be coupled to one or more of the fuse-monitoring devices 102.

The hub device 202 may further include logic 214 to perform one or more functions. For instance, the hub device 202 may couple to (and create a system with) each of the fuse-monitoring devices 102, and receive data from each of the fuse-monitoring devices 102. The hub device 202 may receive device identifiers for each of the fuse-monitoring devices 102, receive notifications 204 from the fuse-monitoring devices 102 indicating that a movement was detected due to a fuse of a fuse holder blowing, receive time data indicating a time at which the fuse blew, receive location data indicating GPS coordinates for the fuse-monitoring devices 102, and so forth. Accordingly, if the hub device 202 receives a notification 204 from a fuse-monitoring device 102, the hub device 202 may determine, using the logic 214, to relay the notification 204 through the network(s) 208 to the servers 210. In some examples, the notification 204 may indicate one or more a location 216 indicating a GPS location of the fuse-monitoring devices 102 (and associated fuse cutouts 104), a device ID 218 indicating a unique device identifier for the fuse-monitoring device(s) 102 that detected the blown fuse, and/or a time 220 at which the fuse-monitoring device 102 detected the movement caused by the blown fuse in the fuse holder of the opened fuse cutout 104.

The logic 214 of the hub device 202 may further perform additional operations. For instance, if two of the three fuse-monitoring devices 102 send a notification to the hub device 202 that movement was caused by blown fuses, then the logic 202 may determine that it is likely that all three phases are actually out. Further, the logic 214 of the hub device 202 may cause the communication component 212 to periodically (e.g., daily) ping the fuse-monitoring devices 102 to ensure that communications are established, and also notify the servers 210 that the hub device 202 is able to communicate with each of the fuse-monitoring devices 102.

Upon receiving the notification 204, the servers 210 may perform various operations. For instance, the servers 210 of the utility provider 206 may determine, based on the device ID 218, a type of fuse (e.g., 100A, 200A, 300A, etc.) in the fuse cutout 104 that has blown and needs to be replaced. In some examples, the servers 210 may have previously received, and stored, the location 216 of the fuse-monitoring device(s) 102. In such examples, the notification 204 may simply include the device ID 218 as the servers 210 know, for each device ID, the location 216. Upon determining that the fuse-monitoring device(s) 102 detected movement indicating a blown fuse for the fuse cutout(s) 104, the servers 210 may cause a line crew 222 to be dispatched from a physical location 224 of the utility provider to the location 216 on the distribution lines 122. The line crew 222 may also know the type of fuse that needs to be replaced for the fuse cutout 104 that blew. In this way, rather than tracing the blown fuse of the fuse cutout 104 using customer calls, the utility provider 206 may utilize the notification 204 received from the hub device 202 or the fuse-monitoring device(s) 102 themselves.

Figure 3A:
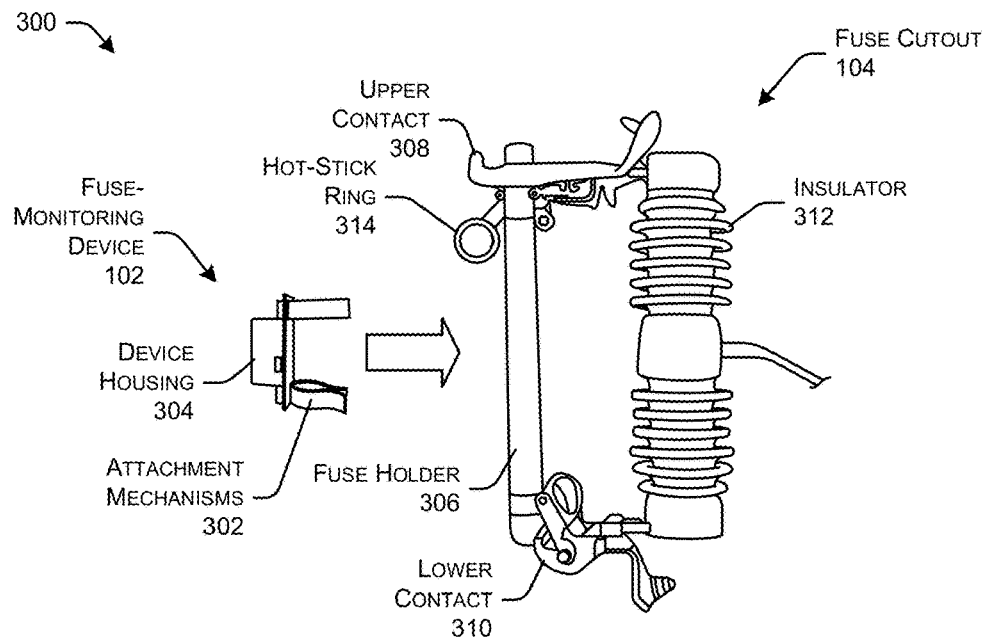
FIG. 3A illustrates an example fuse-monitoring device being detachably coupled to an example fuse cutout.

FIG. 3A illustrates an example system 300 including a fuse-monitoring device 102 being detachably coupled to an example fuse cutout 104. In the illustrated example, the fuse-monitoring device 102 may include one or more attachment mechanisms 302 configured to detachably couple the fuse-monitoring device 102 to the fuse cutout 104. Further, the fuse-monitoring device 102 may comprise a device housing 304 that houses the components of the fuse-monitoring device 102, including mechanical components, electrical components, and so forth.

The fuse cutout 104 may generally comprise a combination of a fuse and a switch. The fuse cutout 104 may be positioned on overhead feeder lines and designed to protect distribution transformers from any current spikes or surges that can overload equipment. The fuse cutout 104 may include a fuse holder 306, also known as the tube or "door," that contains the fuse link. The fuse holder 306 may act as a switch that, when the fuse melts or otherwise operates, the fuse holder 306 will drop open disengaging the switch from the line. This ensures any downstream circuits are electrically isolated. The fuse holder 306 may be held in place by an upper contact 308 and a lower contact 310. The upper contact may disengage from the fuse holder 306 when the fuse melts, and stay connected to the lower contact 310 to swing open. The fuse cutout 104 may also include the insulator body 312 which may comprise either polymer or porcelain material. Further, the fuse cutout 104 may include a hot-stick ring 314 that allows a lineman to utilize a hot-stick to manually replace or reinstall a fuse holder 306.

As illustrated, the fuse-monitoring device 102 may be connected to the fuse holder 306 of the fuse cutoff 104 using the attachment mechanisms 302. Although not illustrated, in some examples the fuse-monitoring device 102 may also include a hot-stick attachment mechanism by which a lineman can interact with using a hot-stick to install the fuse-monitoring device 102 to the fuse holder 306.

Figure 3B:
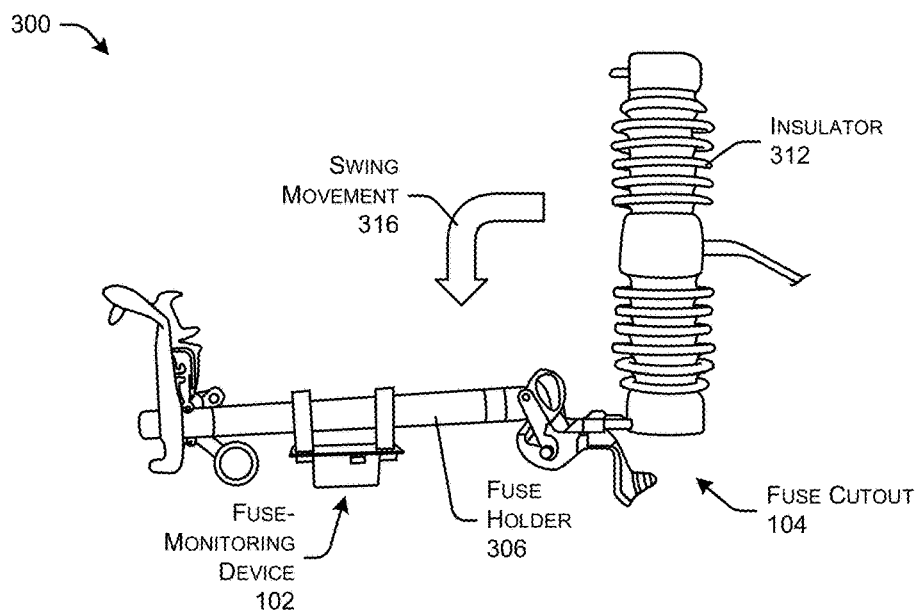
FIG. 3B illustrates an example fuse-monitoring device attached to an example fuse cutout to detect a swing movement of a fuse holder of the fuse cutout.

FIG. 3B illustrates an example fuse-monitoring device 102 attached to an example fuse cutout 104 to detect a swing movement 316 of a fuse holder 306 of the fuse cutout 104. As illustrated, when a fuse blows within the fuse holder 306, the fuse holder 306 detach from the upper contact 308 of the fuse cutout 104 and swing open (e.g., swing movement 316). In this way, the fuse-monitoring device 102 may utilize the movement sensor to detect the movement of the fuse holder 306 which indicates that the fuse blew.

Figure 4:
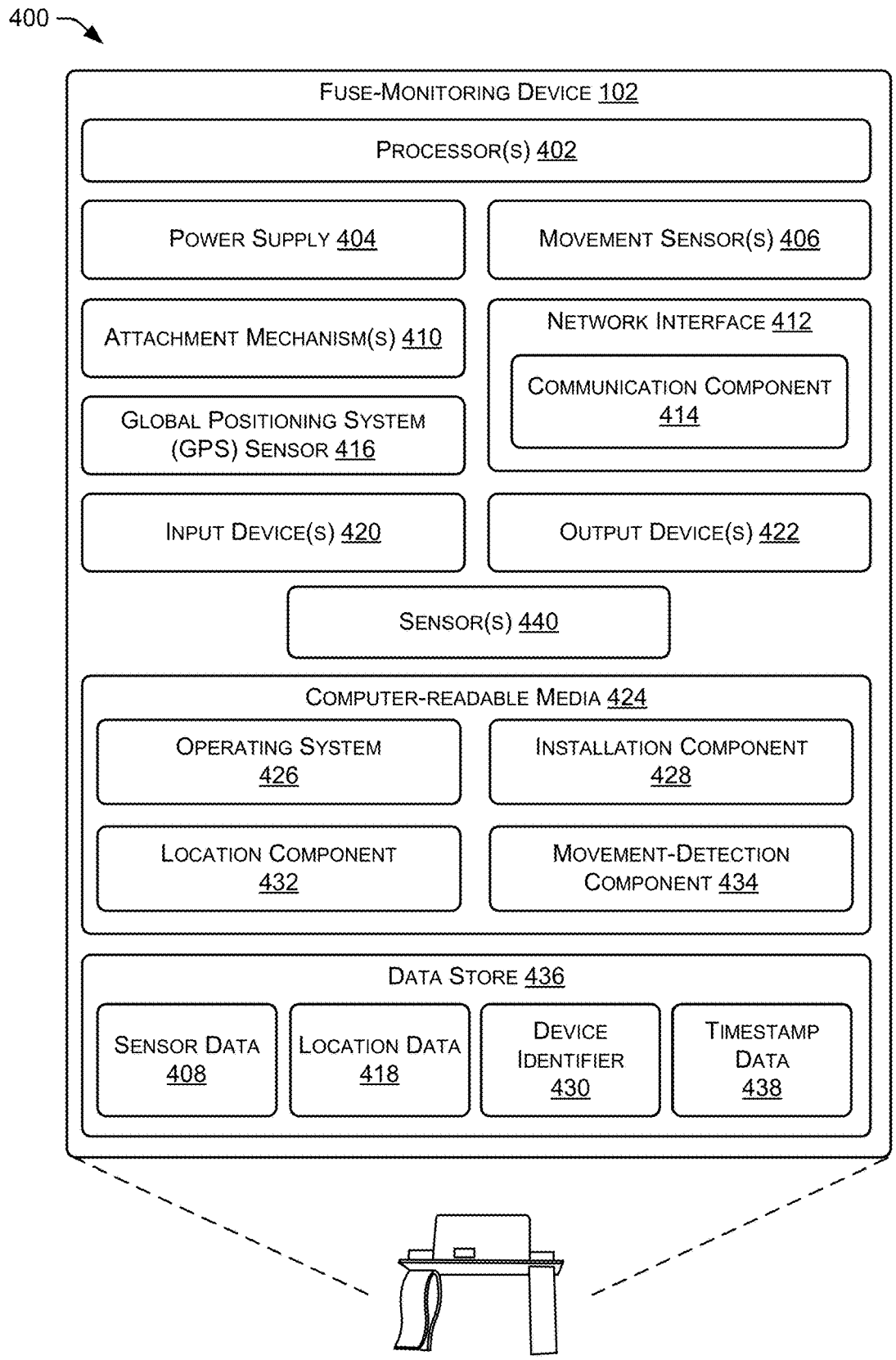
FIG. 4 illustrates component diagram of an example fuse-monitoring device configured to determine that a fuse cutout has blown a fuse, and notify a utility provider of a location of the fuse cutout.

FIG. 4 illustrates component diagram 400 of an example fuse-monitoring device 102 configured to determine that a fuse cutout 104 has blown a fuse, and notify a utility provider 206 of a location of the fuse cutout 104.

The fuse-monitoring device 102 may include one or more processors 402 configured to power components of the fuse-monitoring device 102, such as hardware components and software components. The fuse-monitoring device 102 may include one or more power supplies 404 as well, such as an internal battery. The internal battery may, in some examples, be recharged (e.g., recharged by a solar panel). In some examples, the power supply 404 may comprise an external power supply in some examples, such as an electrical connection to the power line in the distribution system.

The fuse-monitoring device 102 may further include one or more movement sensors 406 configured to generate sensor data 408 indicating changes in orientation and/or changes in position. For instance, the movement sensor(s) 406 may comprise at least one of an accelerometer, a gyroscope, a compass, a magnetometer, a ball bearing tilt switch, and/or any other type of motion and/or inertial sensor.

The fuse-monitoring device 102 may also include one or more attachment mechanisms 410, such as attachment mechanisms 302. The attachment mechanism(s) 410 may be used to detachably couple the fuse-monitoring device 102 to a fuse holder 306 of a fuse cutout 104. In some examples, the attachment mechanism(s) 410 may be interchangeable such that differently sized attachment mechanism(s) 410 may be placed on the fuse-monitoring device 102 in order to couple to differently sized fuse holders 306. For instance, the fuse holders 306 may vary in diameter (e.g., ½ inch diameter, ¾ inch diameter, etc.), and the attachment mechanism(s) 410 may be configured, or sized, to at least partially wrap around, snap onto, etc., the differently sized diameters. In some examples, the attachment mechanism(s) 410 may be removeable such that differently sized attachment mechanism(s) 410 may be removed and added for a fuse-monitoring device 102 to attach to differently sized fuse holders 306 for different types of fuses. The attachment mechanism(s) 410 may further include a hot-stick attachment mechanism (e.g., a ring) that allows a lineman to utilize a hot-sick to install the fuse-monitoring device 102 to a fuse holder 306.

The fuse-monitoring device 102 may also include a network interface 412 which comprises a communication component 414. The network interface(s) 412 may enable communications between the fuse-monitoring device 102 and other networked devices, such as the hub device 202 and/or the servers 210. Such network interface(s) 412 can include one or more network interface controllers (NICs) or other types of transceiver devices to send and receive communications over a network, such as network(s) 208. For instance, the network interface(s) 412 may include a personal area network (PAN) component to enable communications over one or more short-range wireless communication channels. For instance, the PAN component may enable communications compliant with at least one of the following standards IEEE 802.15.4 (ZigBee), IEEE 802.15.1 (Bluetooth), IEEE 802.11 (WiFi), or any other PAN communication protocol. Furthermore, the network interface(s) 412 may include a wide area network (WAN) component to enable communication over a wide area network. The networks that the fuse-monitoring device 104 may communicate over may represent an array of wired networks, wireless networks, such as WiFi, or combinations thereof.

The fuse-monitoring device 102 may also include a global positioning system (GPS) sensor 416, which may comprise receivers with antennas that use a satellite-based navigation system with a network of satellites. The fuse-monitoring device 102 may, at least periodically, obtain GPS coordinates indicating a location, or an absolute geographic location, of the fuse-monitoring device 102. However, in some examples, the fuse-monitoring device 102 may include a cellular modem configured to triangulate the location of the fuse-monitoring device 102 using cell towers. Thus, the fuse-monitoring device 102 may generate, using the GPS sensors 416, the location data 418 that indicates the location of the fuse-monitoring device 102.

The fuse-monitoring device 102 may also include one or more input devices 420 to receive input from a user, such as a lineman. The input device(s) 420 may include one or more buttons, one or more displays, and/or other input device(s) 420 to receive input from a user. Further, the fuse-monitoring device 102 may include one or more output devices 422, such as a display, a loudspeaker, one or more lights (e.g., light emitting diodes), and/or other types of output device(s) 422.

The fuse-monitoring device 102 may also include computer-readable media 424, which may store various components, or computer-executable instructions configured to, when executed by the processor(s) 402, perform various operations. The computer-readable media 424 may include an operation system 426 that is configured to manage hardware and/or software resource devices such as the network interface(s), the I/O devices of the respective apparatuses, and so forth, and provide various services to applications or components executing on the processors.

The computer-readable media 424 may also store an installation component 428 configured to perform various operations for installing, and after installing, the fuse-monitoring device 102. The installation component 428 may determine that the fuse-monitoring device 102 has been attached to a fuse holder 306. For instance, the installation component 428 may detect, such as by using an input device 420 like a button, that the fuse-monitoring device 102 has been connected to fuse holder 306. The button may be positioned on an inside of an attachment mechanism 410 such that, when the fuse-monitoring device 102 is attached to a fuse holder 306, the button is pressed. In this way, and other ways in some examples, the installation component 428 may detect that the fuse-monitoring device 102 has been attached to a fuse holder 306. The installation component 418 may perform various operations once installed on the fuse holder 306. For example, the installation component 418 may utilize the GPS sensor 416 to generate the location data 418. Further, the installation component may cause the fuse-monitoring device 102 to transmit or send, using the network interface 412, the location data 418 and a device identifier 430 for the fuse-monitoring device 102 to the hub device 202, or the servers 210. In this way, the utility provider 206 may determine the location of the fuse-monitoring device 102, as well as the device ID 430, for the fuse-monitoring device 102. The device ID 430 may comprise a device serial number, an IP address, and/or another device ID 430 that is unique to the fuse-monitoring device 102.

The computer-readable media 424 may further store a location component 432 configured to determine the location data 418. For example, the location component 432 may cause the GPS sensor 416 to collect the location data 418 periodically, continuously, and/or upon the fuse-monitoring device 102 detecting movement. The computer-readable media 424 may store a movement-detection component 434 configured to analyze sensor data 408 generated by the movement sensor(s) 406. For instance, the movement-detection component 434 may determine that the orientation and/or position of the fuse-monitoring device 102 has changed by more than a threshold amount. In this way, false positives such as the wind moving the utility pole 106, and/or other false positives, do not result in a detection of a blown fuse when the fuse did not blow.

The fuse-monitoring device 102 may further include a data store 436 that stores sensor data 408, location data 418, device identifier 430, and/or time stamp data 438 that indicates the time at which a blown fuse was detected due to swing movement 316 of the fuse holder 306.

The fuse-monitoring device 102 may, in addition or as an alternative to the movement sensor(s) 406, may include one or more sensors 440 to determine that a fuse has blown. A fuse holder may not always swing open when the fuse has blown. However, other types of sensors 440 may be utilized to determine that the fuse has blown despite there not being a swinging motion. Thus, the fuse-monitoring devices 102 described herein may in addition to movement sensors 406, or as an alternative to movement sensors 406, include one or more of a vibration sensor 440 (e.g., accelerometer), a thermal sensor 440, a microphone (e.g., input device 420), an inductive sensor 440, etc. For instance, an accelerometer may detect the fuse holder 306 vibrating when the fuse has blown, but not swinging, that indicates the fuse has blown. A thermal sensor 440 may detect an increase in heat that is emitted due to a fuse melting in the fuse holder 306 when the fuse has blown. A microphone may detect sound that is characteristic of a fuse blowing inside of the fuse holder 306, etc. Each of the sensors 440 may generate sensor data 408 which may be analyzed by a component of the fuse-monitoring device 102 (e.g., movement-detection component 434) in order to determine that a fuse has blown. For instance, a threshold amount of heat, or a threshold change in heat emitted, may indicate that a fuse has blown. A threshold amount of vibration, or vibration detected for a particular period of time indicative of a fuse blowing, may indicate that a fuse has blown. Further, a sound with a particular acoustic signature, or length of time, may indicate that a fuse has blown.

In some examples, the fuse-monitoring devices 102 may include two or more sensors that are used in conjunction to detect that the fuse of the fuse cutout 104 has blown. For instance, the fuse-monitoring devices 102 may include two or more of a movement sensor 406, a thermal sensor 440, a microphone (e.g., input device 420), and/or a vibration sensor 440. The two or more sensors could each generate respective sensor data that could be used to determine, with a higher level of confidence, whether or not the fuse has blown in the fuse cutout 104. For instance, the movement sensor 406 indicates movement, and a thermal sensor also indicates heat, the fuse-monitoring device 102 may determine that the fuse has blown. In some examples, the fuse-monitoring device 102 may assign confidence scores to sensor data generated by the two or more sensors to determine whether or not the fuse has blown. For instance, a movement sensor 406 may generate sensor data 408 indicating that movement was detected, but the movement may not be greater than a threshold amount of movement to have high enough confidence that the fuse blown. In such an example, the thermal sensor 440 may also generate sensor data 408 that indicates heat was emitted from the fuse cutout 104. The combination of the thermal heat, in addition to the movement, may give the fuse-monitoring device enough confidence that the fuse did blow for the fuse cutout 104. Additionally, different combinations of sensors may be utilized, and any number of sensors may be included in, the fuse-monitoring device 102. In some examples, two or more of the sensors may individually generate sensor data indicating that a fuse has blown in order for the fuse-monitoring device 102 to be confident that the fuse has blown. In some examples, none of the two or more sensors may indicate that the fuse has blown on its own, but the combination of their respective sensor data may give the fuse-monitoring device 102 enough confidence to determine that the fuse has blown.

As used herein, a processor, such as processor(s) 402 may include multiple processors and/or a processor having multiple cores. Further, the processors may comprise one or more cores of different types. For example, the processors may include application processor units, graphic processing units, and so forth. In one implementation, the processor may comprise a microcontroller and/or a microprocessor. The processor(s) 402 may include a graphics processing unit (GPU), a microprocessor, a digital signal processor or other processing units or components known in the art. Alternatively, or in addition, the functionally described herein can be performed, at least in part, by one or more hardware logic components. For example, and without limitation, illustrative types of hardware logic components that can be used include field-programmable gate arrays (FPGAs), application-specific integrated circuits (ASICs), application-specific standard products (ASSPs), system-on-a-chip systems (SOCs), complex programmable logic devices (CPLDs), etc. Additionally, each of the processor(s) 402 may possess its own local memory, which also may store program components, program data, and/or one or more operating systems.

Further, functional components may be stored in the respective memories, or the same functionality may alternatively be implemented in hardware, firmware, application specific integrated circuits, field programmable gate arrays, or as a system on a chip (SoC). In addition, while not illustrated, each respective memory, such as computer-readable media 424 and/or memory, discussed herein may include at least one operating system (OS) component that is configured to manage hardware resource devices such as the network interface(s), the I/O devices of the respective apparatuses, and so forth, and provide various services to applications or components executing on the processors. Such OS component may implement a variant of the FreeBSD operating system as promulgated by the FreeBSD Project; other UNIX or UNIX-like variants; a variation of the Linux operating system as promulgated by Linus Torvalds; the FireOS operating system from Amazon.com Inc. of Seattle, Wash., USA; the Windows operating system from Microsoft Corporation of Redmond, Wash., USA; LynxOS as promulgated by Lynx Software Technologies, Inc. of San Jose, Calif.; Operating System Embedded (Enea OSE) as promulgated by ENEA AB of Sweden; and so forth.

Figure 5:
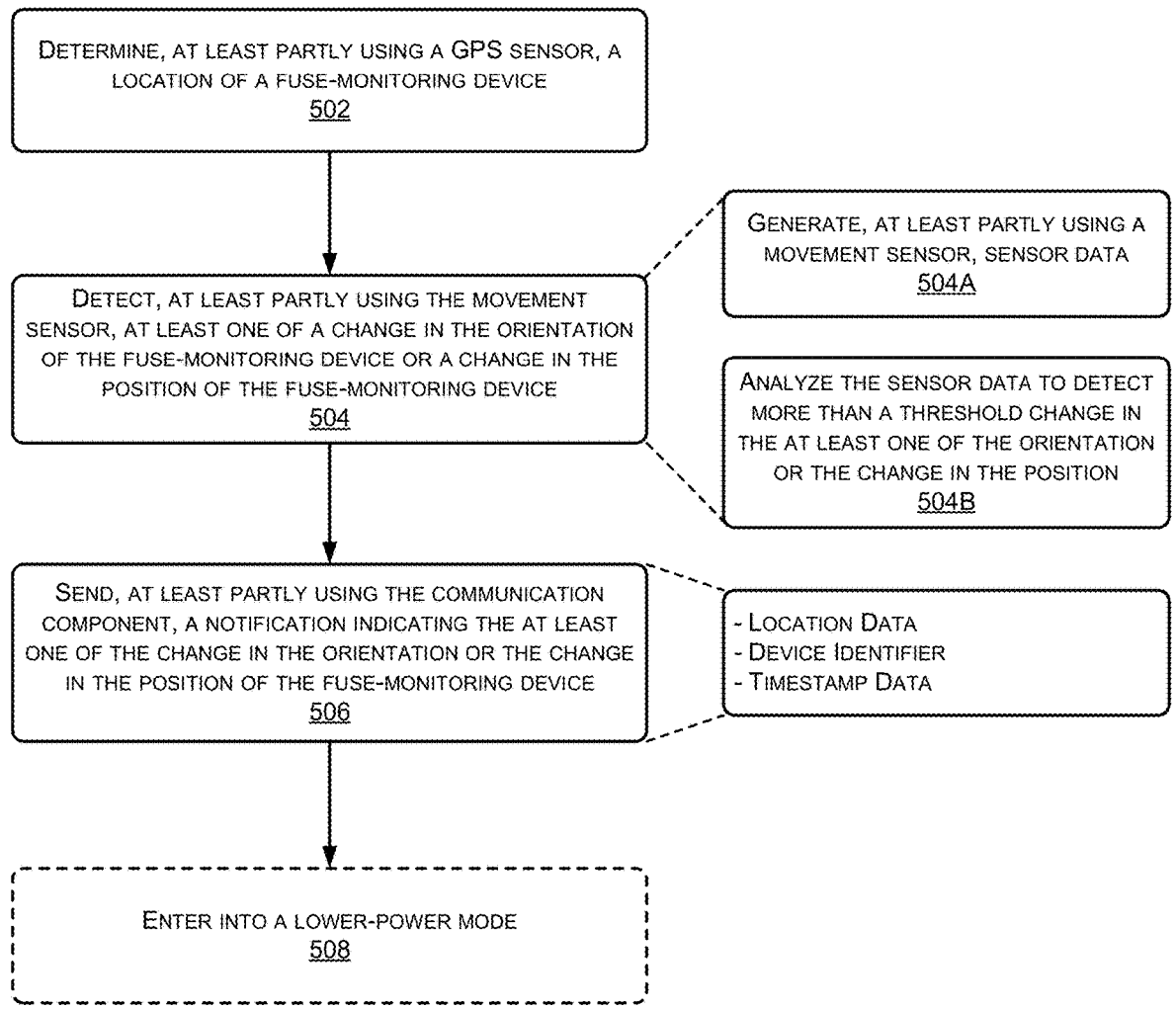
FIG. 5 illustrates a flow diagram of an example process for detecting movement of a fuse-monitoring device that indicates that a fuse of a fuse cutout has blown.
Figure 6:
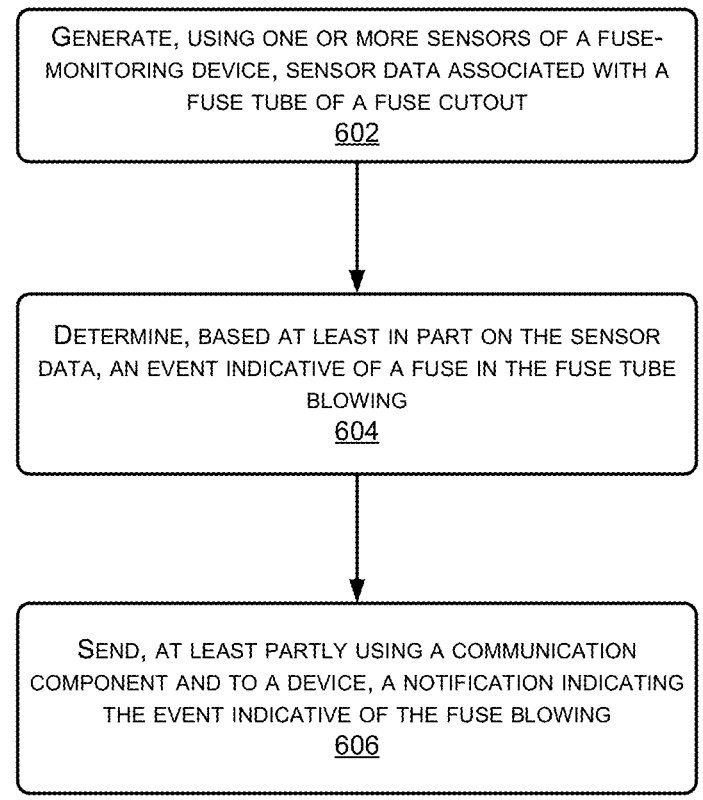
FIG. 6 illustrates a flow diagram of an example process for using sensor data generated by one or more sensors of a fuse-monitoring device to determine that a fuse of a fuse cutout has blown.

FIGS. 5 and 6 are flow diagrams illustrating example processes 500 and 600 according to the techniques described herein. The flow of operations in the example processes are illustrated as a collection of blocks and/or arrows representing a sequence of operations that can be implemented in hardware, software, firmware, or a combination thereof. The order in which the blocks are described is not intended to be construed as a limitation, and any number of the described operations can be combined in any order to implement one or more methods, or alternate methods. Additionally, individual operations may be omitted from the flow of operations without departing from the spirit and scope of the subject matter described herein. In the context of software, the blocks represent computer instructions that, when executed by one or more processors, perform the recited operations. In the context of hardware, the blocks may represent one or more circuits (e.g., application specific integrated circuits—ASICs) configured to execute the recited operations.

FIG. 5 illustrates a flow diagram of an example process 500 for detecting movement of a fuse-monitoring device 102 that indicates that a fuse of a fuse cutout 104 has blown.

At 502, the fuse-monitoring device 102 may determine, at least partly using a GPs sensor, a location of the fuse-monitoring device. For example, the installation component 428 may, upon installing the fuse-monitoring device 102 onto a fuse holder 306, cause the GPS sensor 416 to determine location data 418 indicating a location of the fuse-monitoring device 102. In some examples, the movement-detection component 434 may cause the GPS sensor 416 to determine the location data 418 upon detecting more than a threshold change in orientation and/or position.

At 504, the fuse-monitoring device 102 may detect, at least partly using the movement sensor, at least one of a change in the orientation of the fuse-monitoring device 102 or a change in the position of the fuse-monitoring device 102. In some examples, at 504A the movement sensor(s) 406 may generate sensor data 408 that represents the change in orientation and/or the change in movement. The movement-detection component 434 may, at 504B, analyze the sensor data to detect more than a threshold change in the at least one of the orientation or the change in the position.

At 506, the fuse-monitoring device 102 may send, at least partly using the communication component, a notification indicating the at least one of the change in the orientation or the change in the position of the fuse-monitoring device 102. In some examples, the notification may include one or more of location data indicating a GPS location of the fuse-monitoring device 102, device identifier data indicating a device ID of the fuse-monitoring device 102, and/or time-stamp data indicating a time at which the change in the orientation and/or the change in the position of the fuse-monitoring device 102 occurred.

In some instances, sending the notification may comprise causing the notification to be sent to a server associated with a central office over an advanced metering infrastructure (AMI) network, or causing the notification to be sent to the server associated with the central office over a cellular network. In various examples, sending the notification may comprise transmitting, over a short-range wireless communication standard, the notification to a smart node (e.g., hub device) in an advanced metering infrastructure (AMI) network.

In some examples, the fuse-monitoring device 102 may, optionally at 508, enter into a lower-power mode. For instance, the fuse-monitoring device 102 may power down at least one component, such as the movement sensor, the communication component, etc., after sending the notification. In this way, the fuse-monitoring device 102 may refrain from consuming battery power until the fuse-monitoring device 102 has been reinstalled with a new fuse, and/or installed in a new location after being taken down from a previous location.

In some examples, based at least in part on detecting at least one of the change in the orientation or the change in the position of the fuse-monitoring device 102, the fuse-monitoring device may perform at least one of causing a loud speaker included in the fuse-monitoring device 102 to output sound, or cause a light of the fuse-monitoring device 102 to output light.

In various examples, a system includes multiple fuse-monitoring devices 102 monitoring different phases of a power line, as well as a hub device 202 configured to communicate with the multiple fuse-monitoring devices 102. Each of the fuse-monitoring devices 102 may monitor fuse holders 306 of respective fuse cutouts 104 on each phase.

FIG. 6 illustrates a flow diagram of an example process 600 for using sensor data 408 generated by one or more sensors 406 and/or 440 of a fuse-monitoring device 102 to determine that a fuse of a fuse cutout has blown.

In some examples, the fuse-monitoring device 102 may be installed, such as being removeably or detachably coupled, to a fuse holder 306 of a fuse cutout 104. For example, a line crew 222 may use a hot stick, or otherwise install, the fuse-monitoring device 102 on the fuse holder 306. In some examples, the fuse-monitoring device 102 may include a GPS sensor 416 that may be utilized to determine the geographic location of the fuse-monitoring device 102. However, more simply fuse-monitoring devices 102 may not include GPS sensors, or any other location sensors. Instead, the line crew 222 may record or otherwise determine a location of the fuse-monitoring device 102 upon installation, and keep track of the location of the fuse-monitoring device 102 at a location of the utility provider 206. In this way, the utility provider 206 may know the location of the fuse-monitoring device 102, but the fuse-monitoring device 102 may not include a location sensor to notify the utility provider 206 of the location of the fuse-monitoring device 102.

At 602, the fuse-monitoring device 102 may generate, using one or more sensors, sensor data associated with the fuse tube of the fuse cutout. Generally, the sensors used to generate the sensor data 408 may include a movement sensor 406, a sensor 440, and/or any combination of multiple sensors 406 and/or 440. For instance, the one or more sensors may include a movement sensor 406 configured to generate sensor data that may be used to indicate at least one of a change in the orientation of the fuse-monitoring device 102 or a change in the position of the fuse-monitoring device 102. In some examples, the movement sensor(s) 406 may generate sensor data 408 that represents the change in orientation and/or the change in movement. The movement-detection component 434 may analyze the sensor data 408 to detect more than a threshold change in the at least one of the orientation or the change in the position.

In various examples, the fuse-monitoring device 102 may include additional, or alternative, sensors 440 to generate sensor data 408. For instance, the sensor may comprise a thermal sensor 440 configured to generate the sensor data representing thermal heat emitted. The fuse-monitoring device 102 may also include a microphone to detect sound that indicates the fuse blew, such as a sound that is at a threshold volume, has a known acoustic signature, or lasts for a known period of time.

At 604, the fuse-monitoring device 104 may determine, based at least in part on the sensor data, an event indicative of a fuse in the fuse tube blowing. In some examples, the sensor comprises a thermal sensor configured to generate the sensor data representing thermal heat emitted, and determining the event indicative of the fuse blowing includes analyzing the sensor data to detect at least one of more than a threshold change in the thermal heat emitted from the fuse tube or more than a threshold amount of the thermal heat emitted from the fuse tube.

In some examples, the sensor comprises a movement sensor configured to detect at least one of a change in orientation of the fuse-monitoring device or a change in position of the fuse-monitoring device, and determining the event indicative of the fuse blowing includes detecting, at least partly using the sensor data, at least one of a change in the orientation of the fuse-monitoring device or a change in the position of the fuse-monitoring device.

At 606, the fuse-monitoring device 102 may send, at least partly using a communication component and to a device (e.g., hub device 202, severs 210, etc.), a notification indicating the even indicative of the fuse blowing. In some examples, the notification may further include one or more of location data indicating a GPS location of the fuse-monitoring device 102, device identifier data indicating a device ID of the fuse-monitoring device 102, and/or time-stamp data indicating a time at which the event occurred.

Figure 7:
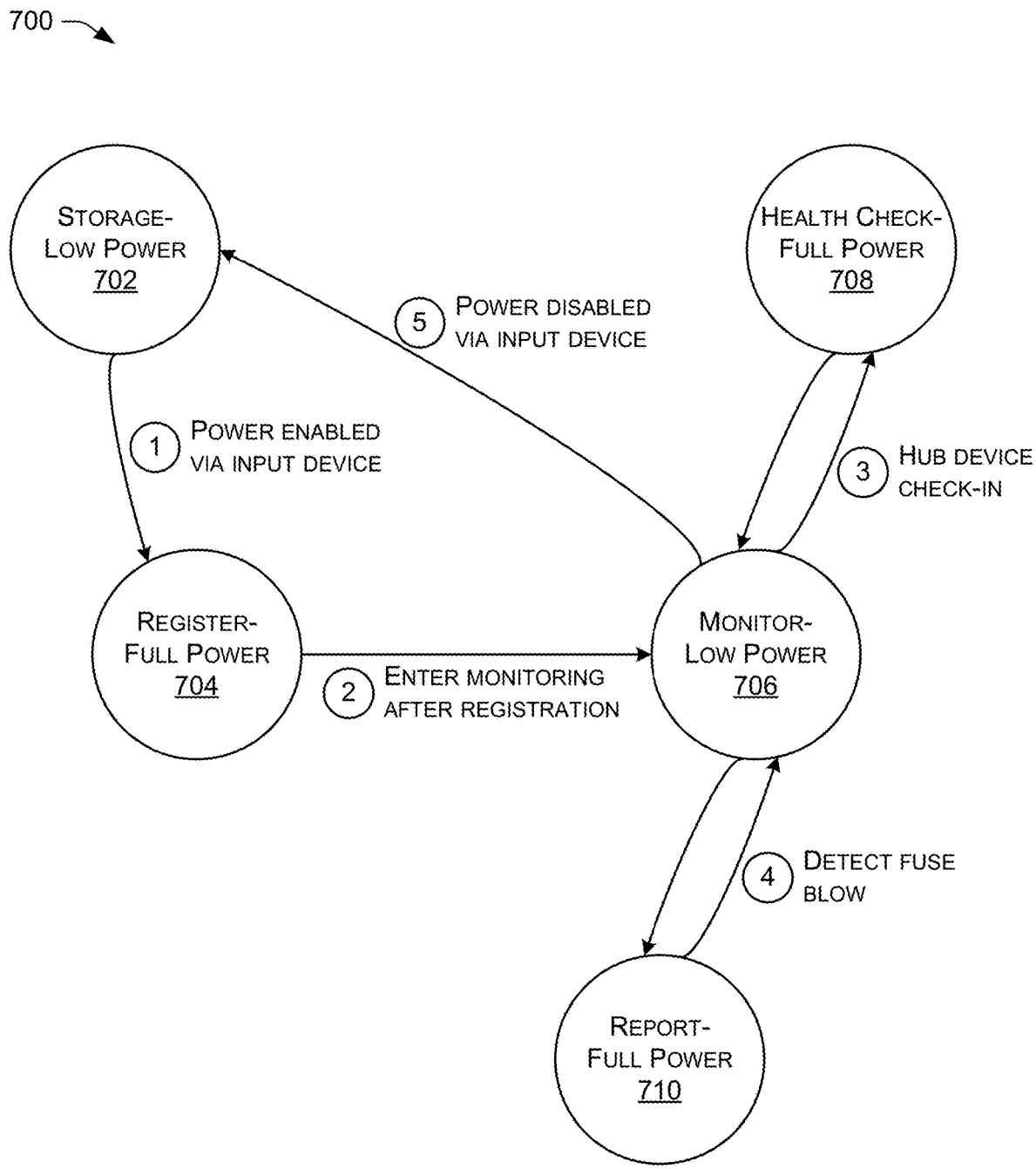

FIG. 7 illustrates a state diagram 700 indicating example power states that a fuse-monitoring device 102 progresses through.

As illustrated, the fuse-monitoring device 102 may originally be in a storage—low power state 702. For instance, when the fuse-monitoring device 102 is not in use, such as being in storage at a physical location 224 of the utility provider 206, the fuse-monitoring device 102 may be in the storage—low power state 702 in which the fuse-monitoring device 102 is entirely powered off, or consuming very little power by activating few components.

At "1," the fuse-monitoring device 102 may have power enabled by receiving input via an input device 420. For example, a line crew 222 may take the fuse-monitoring device 102 to a location on a line, such as a distribution line 122, at which the fuse-monitoring device 102 will be installed. The line crew 222 may provide input to the fuse-monitoring device 102 via an input device 420, such as a magnetic switch, a pull tab, or any other electrical, mechanical, and/or electromechanical input device 420.

The fuse-monitoring device 102 may transition into a register—full power state 704 after receiving the input via the input device 420. Generally, in the register—full power state 704, the fuse-monitoring device 102 may be in a normal operation mode where some, or all, of the components are powered by the power supply 404. For instance, the fuse-monitoring device 102 may initiate the operating system 426, the installation component 428, location component 432, movement-detection component 434, GPS sensor 416, sensors 406/440, and or any other devices of the fuse-monitoring device 102.

At "2," the fuse-monitoring device 102 may enter into monitoring after registration has completed. For instance, the fuse-monitoring device 102 may register by utilizing the GPS sensor 416 to determine location data 418 that is provided to at least one of the hub device 202, the servers 210, and/or the line crew 222. Further, the fuse-monitoring device 102 may instantiate communication connections with the hub device 202, such as by pairing with the hub device 202 or otherwise registering for communication.

The fuse-monitoring device 102 may enter into a monitor—low power state 706. In the monitor—low power state 706, the fuse-monitoring device 102 may power down at least some of the components, such as the GPs sensor 416, the installation component 428, the location component 432, etc. However, the fuse-monitoring device 102 may maintain power to at least some of the components, such as movement sensor 406, sensors 440, movement-detection component 434, and/or other components. In this way, the fuse-monitoring device 102 may provide at least enough power to components that are required to detect a blown fuse, but refrain from powering components that do not help detect a blow fuse.

At "3," the fuse-monitoring device 102 may optionally (not always required) perform a check-in with the hub device 202. For instance, the fuse-monitoring device 102 may be configured to, at least periodically, transition into a health check—full power 708 state and power at least the network interface 412 to notify the hub device 202 (and/or servers 210) that the fuse-monitoring device 102 is operating normally. In this way, the hub device 202 and/or servers 210 know that the fuse-monitoring device 102 is operating normally and is healthy, and that any "silence" from the fuse-monitoring device 102 means that the monitored fuse has not blown.

At "4," the fuse-monitoring device 102 may detect a fuse blow according to the various techniques described herein (e.g., swinging of fuse, thermal heat emitted from blown fuse, vibrations corresponding to a blown fuse, sound corresponding to an acoustic fingerprint of a fuse blowing, etc.).

The fuse-monitoring device 102 may then transition into a report—full power 710 state. In the report—full power state 710, the fuse-monitoring device 102 may power various components to report the blown fuse to one or more devices. For instance, the fuse-monitoring device 102 may power the network interface 412 to transmit a notification that the fuse blew to the hub device 202, servers 210, etc. Further, the fuse-monitoring device 102 may power the GPS sensor 416 to determine location data 418 to be sent with the notification. In this way, additional power is drawn by components of the fuse-monitoring device 102 in the report—full power state 710 than in the monitor—lower power state 706 from which the fuse-monitoring device 102 transitioned. After reporting the notification of the blown fuse, the fuse-monitoring device 102 may transition back into the monitor—low power state 706.

At "5," the fuse-monitoring device 102 may receive input via an input device 410 indicating that power is to be disabled. For instance, the fuse-monitoring device 102 may receive input from the line crew 222 via an input device 420, such as a magnetic switch, a pull tab, or any other electrical, mechanical, and/or electromechanical input device 420. This may indicate that the fuse-monitoring device 102 is being uninstalled, and the fuse-monitoring device 102 may enter into the storage—low power s702 state by powering down some or all of the components.

While the foregoing invention is described with respect to the specific examples, it is to be understood that the scope of the invention is not limited to these specific examples. Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Although the application describes embodiments having specific structural features and/or methodological acts, it is to be understood that the claims are not necessarily limited to the specific features or acts described. Rather, the specific features and acts are merely illustrative some embodiments that fall within the scope of the claims of the application.

What is claimed is:

1. A system comprising:
   a fuse-monitoring device comprising:
      one or more processors;
      an attachment mechanism configured to detachably couple the fuse-monitoring device to a fuse tube of a fuse cutout;
      a sensor configured to generate sensor data associated with the fuse tube of the fuse cutout;
      a communication component; and
      one or more computer-readable media storing computer-executable instructions that, when executed by the one or more processors, cause the one or more processors to:
         send, at least partly using the communication component and to a device:
            location data associated with a location of the fuse-monitoring device, and
            an identifier of the fuse-monitoring device;
         generate, at least partly using the sensor, the sensor data;
         determine, based at least in part on the sensor data, an event indicative of a fuse in the fuse tube blowing; and send, at least partly using the communication component and to the device, a notification indicating:
the event indicative of the fuse blowing, and
the identifier of the fuse-monitoring device, the identifier being used to determine the location of the fuse-monitoring device.

2. The system of claim 1, wherein:
the sensor comprises a thermal sensor configured to generate the sensor data representing thermal heat emitted; and
determining the event indicative of the fuse blowing includes analyzing the sensor data to detect at least one of more than a threshold change in the thermal heat emitted from the fuse tube or more than a threshold amount of the thermal heat emitted from the fuse tube.

3. The system of claim 1, wherein the fuse-monitoring device comprises a first fuse-monitoring device, further comprising:
a hub device comprising:
one or more second processors;
a second communication component; and
one or more second computer-readable media storing second computer-executable instructions that, when executed by the one or more second processors, cause the one or more second processors to:
receive, from the first fuse-monitoring device, the notification;
receive, from a second fuse-monitoring device, a second notification indicating another event indicative of another fuse in another fuse tube blowing;
determine, based at least in part on the notification and the second notification, that a three-phase power line experienced an overcurrent event; and
sending, at least partly using the second communication component, a third notification indicating the overcurrent event to the device associated with a utility office.

4. The system of claim 1, wherein:
the sensor comprises a movement sensor configured to detect at least one of a change in orientation of the fuse-monitoring device or a change in position of the fuse-monitoring device; and
determining the event indicative of the fuse blowing includes detecting, at least partly using the sensor data, at least one of a change in the orientation of the fuse-monitoring device or a change in the position of the fuse-monitoring device.

5. The system of claim 1, wherein the fuse-monitoring device comprises further computer-executable instructions that, when executed, cause the one or more processors to:
cause a loudspeaker included in the fuse-monitoring device to output sound; or
cause a light of the fuse-monitoring device to illuminate.

6. The system of claim 1, wherein the fuse-monitoring device further comprises another attachment mechanism configured to detachably couple the fuse-monitoring device with a hot stick.

7. The system of claim 1, wherein the notification further includes time data indicating a time associated with the event indicative of the fuse in the fuse tube blowing.

8. The system of claim 1, wherein:
the location data and the identifier are sent at a first instance in time; and
the notification is sent at a second instance in time that is after the first instance in time.

9. A method performed at least partly using a fuse-monitoring device, the method comprising:
generating, at least partly using a sensor of the fuse-monitoring device, sensor data associated with a fuse tube of a fuse cutout, wherein the fuse-monitoring device is attached to the fuse tube;
determining, at least partly using the sensor data, an event indicative of a fuse in the fuse tube blowing;
sending, at least partly using a communication component of the fuse-monitoring device, a notification indicating the event indicative of the fuse blowing; and
causing, at least partly responsive to sending the notification, the fuse-monitoring device to transition from a first power mode into a second power mode, wherein the fuse-monitoring device consumes less power in the second power mode than the first power mode.

10. The method of claim 9, wherein:
the sensor comprises a movement sensor configured to generate the sensor data indicative of at least one of a change in orientation of the fuse-monitoring device or a change in position of the fuse-monitoring device; and
determining the event comprises analyzing the sensor data to identify the at least one of the change in the orientation or the change in the position, wherein the change in the orientation or the change in the position of the fuse-monitoring device indicates that the fuse tube of the fuse cutout has opened.

11. The method of claim 9, wherein the notification further includes time data indicating a time associated with the event indicative of the fuse blowing.

12. The method of claim 9, further comprising at least one of, subsequent to determining the event:
outputting, at least partly using a loudspeaker of the fuse-monitoring device, an alert sound; or
outputting, at least partly using a light of the fuse-monitoring device, an alert light.

13. The method of claim 9, further comprising:
determining, at least partly using a global positioning system (GPS) sensor of the fuse-monitoring device, a location of the fuse-monitoring device,
wherein the notification further includes location data indicating the location of the fuse-monitoring device.

14. The method of claim 9, wherein the sensor comprises at least one of a movement sensor, a thermal sensor, or a microphone configured to generate the sensor data used to determine the event indicative of the fuse in the fuse tube blowing.

15. The method of claim 14, wherein the sensor comprises a first sensor, further comprising generating, at least partly using a second sensor of the movement sensor, the thermal sensor, or the microphone, to generate additional sensor data,
wherein:
the second sensor is different than the first sensor; and
the determining the event indicative of the fuse in the fuse tube blowing is based at least in part on the sensor data and the additional sensor data.

16. A system comprising:
one or more processors; and
one or more non-transitory computer-readable media storing computer-executable instructions that, when executed by the one or more processors, cause the one or more processors to perform acts comprising:
receiving, from a sensor, sensor data associated with a fuse tube of a fuse cutout;
determining, based at least in part on the sensor data, a failure of a fuse in the fuse tube;

causing, based at least in part on the failure of the fuse, the system to transition from a first power mode into a second power mode, wherein the system consumes more power in the second power mode than the first power mode; and sending a notification associated with the failure of the fuse.

17. The system of claim 16, the acts further comprising at least one of:

causing, based at least in part on the failure of the fuse, a loudspeaker to output sound; or causing, based at least in part on the failure of the fuse, a light to illuminate.

18. The system of claim 16, wherein the notification includes a time associated with the failure of the fuse.

19. The system of claim 16, further comprising a fuse-monitoring device, wherein the sensor comprises a movement sensor configured to generate sensor data representing at least one of a change in orientation of the fuse-monitoring device or a change in position of the fuse-monitoring device.

20. The system of claim 16, wherein the sensor comprises a thermal sensor configured to generate the sensor data representing thermal heat emitted from the fuse tube.

21. The system of claim 16, further comprising a microphone, the acts further comprising receiving, from the microphone, audio data associated with the fuse tube, wherein determining the failure of the fuse is further based at least in part on the audio data.

22. The system of claim 16, further comprising a global positioning system (GPS) sensor, the acts further comprising determining, at least partly using the GPS sensor, a location associated with the fuse tube, wherein the notification further includes the location of the fuse tube.

* * * * *